(12) United States Patent
Ikeda

(10) Patent No.: US 11,217,587 B2
(45) Date of Patent: Jan. 4, 2022

(54) SEMICONDUCTOR DEVICE WITH CAPACITOR CONTACT SURROUNDED BY CONDUCTIVE RING AND MANUFACTURING METHOD OF THE SEMICONDUCTOR DEVICE

(71) Applicant: Winbond Electronics Corp., Taichung (TW)

(72) Inventor: Noriaki Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/431,746

(22) Filed: Jun. 5, 2019

(65) Prior Publication Data
US 2020/0388618 A1 Dec. 10, 2020

(51) Int. Cl.
| | | |
|---|---|---|
| *H01L 27/108* | (2006.01) | |
| *H01L 49/02* | (2006.01) | |
| *H01L 23/31* | (2006.01) | |
| *H01L 21/311* | (2006.01) | |
| *H01L 21/3213* | (2006.01) | |

(52) U.S. Cl.
CPC .. *H01L 27/10814* (2013.01); *H01L 21/31144* (2013.01); *H01L 21/32133* (2013.01); *H01L 23/3171* (2013.01); *H01L 27/10855* (2013.01); *H01L 27/10885* (2013.01); *H01L 28/60* (2013.01)

(58) Field of Classification Search
CPC ......... H01L 27/10814; H01L 27/10855; H01L 27/10885; H01L 21/32133; H01L 23/3171; H01L 28/60
See application file for complete search history.

(56) References Cited

U.S. PATENT DOCUMENTS

| | | |
|---|---|---|
| 6,822,280 B2 | 11/2004 | Ito et al. |
| 9,041,122 B2 | 5/2015 | Yoo et al. |
| 9,184,166 B2 | 11/2015 | Lee et al. |
| 9,490,256 B2 | 11/2016 | Kim et al. |
| 9,754,946 B1 | 9/2017 | Yang et al. |
| 2015/0060970 A1* | 3/2015 | Sasaki ............... H01L 27/10855 257/296 |
| 2015/0171089 A1 | 6/2015 | Taketani |
| 2015/0255465 A1 | 9/2015 | Yokomichi |

FOREIGN PATENT DOCUMENTS

JP 2012019035 1/2012

* cited by examiner

*Primary Examiner* — Suberr L Chi
(74) *Attorney, Agent, or Firm* — JCIPRNET

(57) ABSTRACT

A semiconductor device and a manufacturing method are provided. The semiconductor device includes an active region, a bit line, a capacitor contact, a conductive ring and a storage capacitor. The active region is formed in a substrate. The bit line and the capacitor contact are disposed over the substrate and electrically connected with the active region. The bit line is laterally separated from the capacitor contact, and a top surface of the bit line is lower than a top surface of the capacitor contact. An upper portion of the capacitor contact is surrounded by the conductive ring. The storage capacitor is disposed over and in electrical contact with the capacitor contact and the conductive ring.

12 Claims, 12 Drawing Sheets

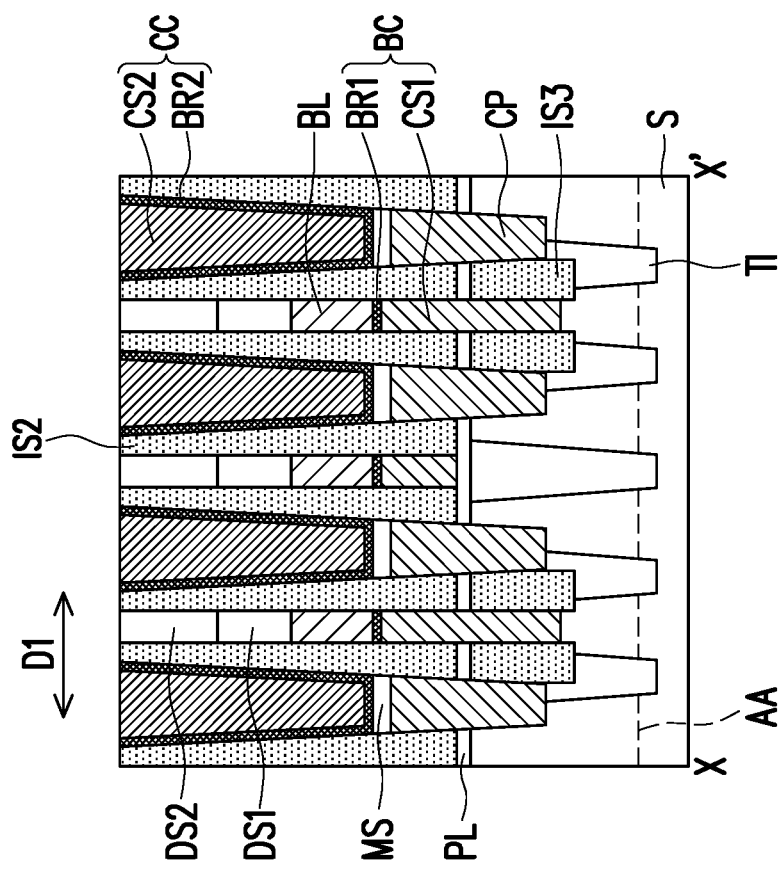
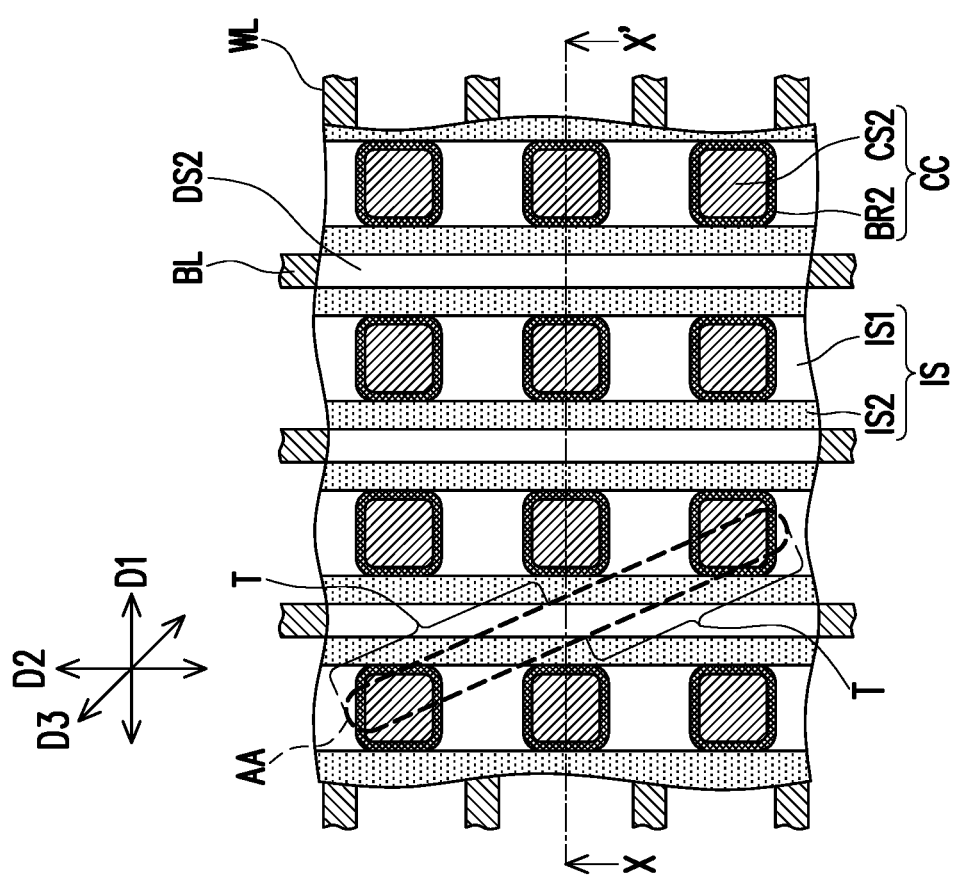
FIG. 2A
FIG. 3A

SEMICONDUCTOR DEVICE WITH CAPACITOR CONTACT SURROUNDED BY CONDUCTIVE RING AND MANUFACTURING METHOD OF THE SEMICONDUCTOR DEVICE

BACKGROUND

Technical Field

The present disclosure relates to a semiconductor device and a manufacturing method thereof, and particularly, to a dynamic random access memory (DRAM) device and a manufacturing method thereof.

Description of Related Art

Dynamic random access memory (DRAM) is a widely used volatile read/write semiconductor memory device. A memory cell of a DRAM integrated circuit includes a field effect transistor and a storage capacitor. A gate of the field effect transistor is connected to a word line, and source and drain of the field effect transistor are connected to a bit line and the storage capacitor. In order to increase the area of the storage capacitor (i.e., the capacitance of the storage capacitor) without excessively reducing the spacing between adjacent storage capacitors in the DRAM integrated circuit, the storage capacitors may be shifted from the underlying capacitor contacts by a certain distance. However, such shift of the storage capacitors may result in overlap between the storage capacitors and bit lines, and punch through problem between the storage capacitors and bit lines may occur.

SUMMARY

Accordingly, the present disclosure provides a DRAM device and a manufacturing method that may avoid the punch through problem between the storage capacitors and the bit lines.

According to some embodiments, a semiconductor device includes an active region, a bit line, a capacitor contact, a conductive ring and a storage capacitor. The active region is formed in a substrate. The bit line and the capacitor contact are disposed over the substrate and electrically connected with the active region. The bit line is laterally separated from the capacitor contact, and a top surface of the bit line is lower than a top surface of the capacitor contact. An upper portion of the capacitor contact is surrounded by the conductive ring. The storage capacitor is disposed over the capacitor contact and the conductive ring.

According to some embodiments, a manufacturing method of a semiconductor device includes: forming an active region in a substrate; forming a bit line and a capacitor contact over the substrate, wherein the bit line is laterally separated from the capacitor contact, the bit line and the capacitor contact are electrically connected with the active region, and a top surface of the bit line is lower than a top surface of the capacitor contact; forming a conductive ring surrounding an upper portion of the capacitor contact; and forming a storage capacitor over the capacitor contact and the conductive ring.

As above, by disposing the conductive ring surrounding the upper portion of the capacitor contact, the conductive ring can protect the elements lying under the conductive ring from being damaged while forming the storage capacitor. Therefore, charge punch through from the storage capacitor via these elements to the underlying bit line can be avoided, and a reliability of the semiconductor device may be improved. Furthermore, by disposing the conductive ring around the upper portion of the capacitor contact, the conductive area for the storage capacitor to be landed over is enlarged. Accordingly, contact margin between the storage capacitor and the capacitor contact is increased. In addition, since the conductive ring can be formed by a self-aligning patterning process, an additional photolithography process is not required.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A through FIG. 2K are schematic top views of structures at various stages during the manufacturing method of the semiconductor device illustrate in FIG. 1.

FIG. 3A through FIG. 3K are schematic cross-sectional views along the lines X-X' shown in FIG. 2A through FIG. 2K, respectively.

DESCRIPTION OF THE EMBODIMENTS

Figure 1:
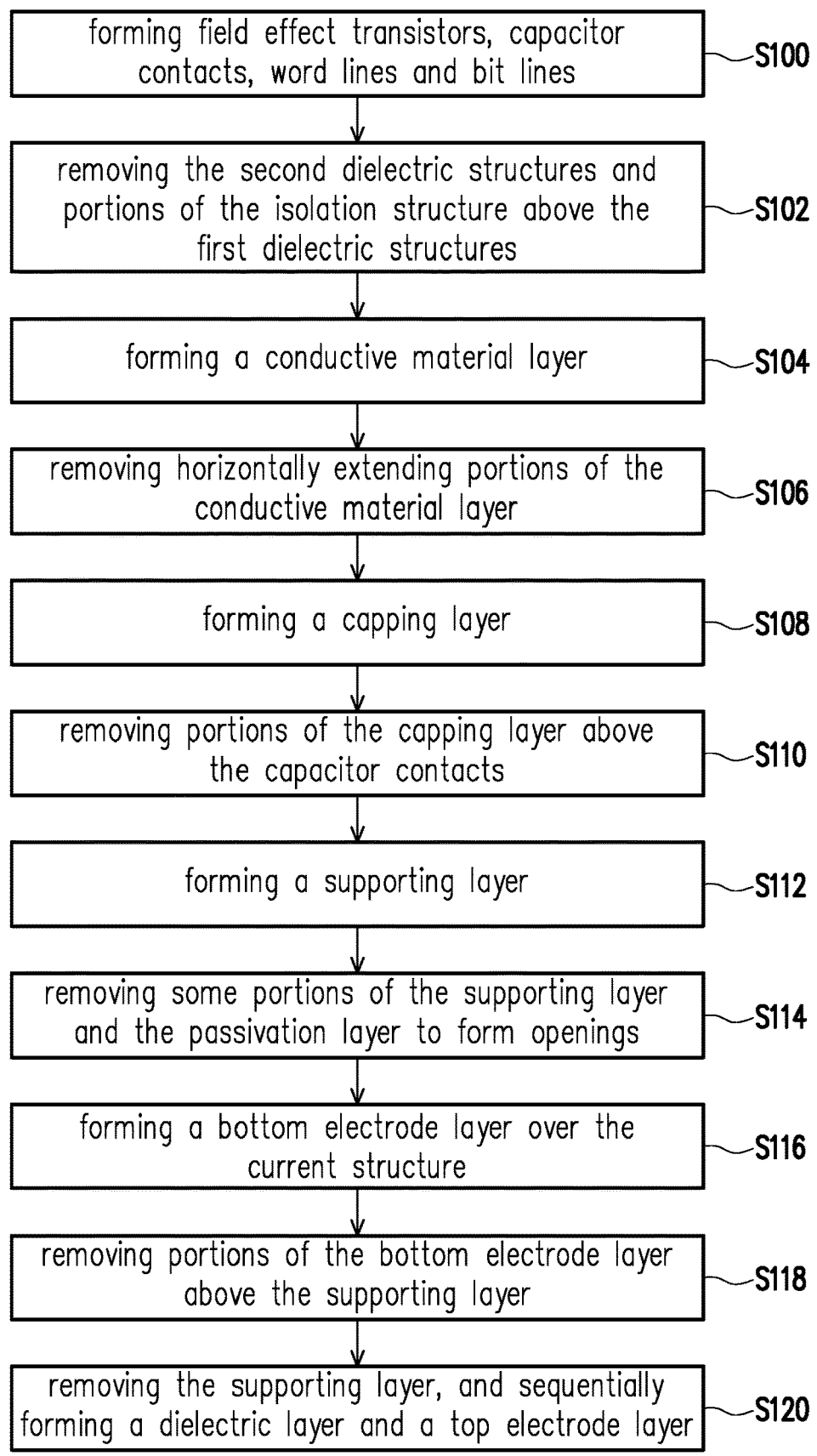
FIG. 1 is a process flow of a manufacturing method of a semiconductor device according to some embodiments of the present disclosure.

FIG. 1 is a process flow of a manufacturing method of a semiconductor device according to some embodiments of the present disclosure. FIG. 2A through FIG. 2K are schematic top views of structures at various stages during the manufacturing method of the memory device illustrate in FIG. 1. FIG. 3A through FIG. 3K are schematic cross-sectional views along the lines X-X' shown in FIG. 2A through FIG. 2K, respectively.

Referring to FIG. 1, FIG. 2A, step S100 is performed, and field effect transistors T, capacitor contacts CC, word lines WL and bit lines BL are formed. In some embodiments, the word lines WL extend along a first direction D1, whereas the bit lines BL extend along a second direction D2 that is intersected with the first direction D1. For instance, the first direction D1 may be perpendicular to the second direction D2. At least one of the field effect transistors T is formed within the span of an active region AA. For instance, as shown in FIG. 2A, two field effect transistors T are formed within the span of the same active region AA. The active region AA is, for example, a doped region in a substrate S (as shown in FIG. 3A), and the field effect transistors T are embedded-type field effect transistors. Even though only a single active region AA is depicted in FIG. 2A, a plurality of the active regions AA are actually formed in the substrate S (as shown in FIG. 3A). The active regions AA are separated from one another, and extend along a third direction D3 that is intersected with the first direction D1 and the second direction D2. For instance, an angle between the second direction D2 and the third direction D3 may range from 20° to 40°. A gate (not shown) of the field effect transistor T is overlapped and electrically connected with one of the word lines WL. In some embodiments, the word lines WL are buried word lines, which are formed in the substrate S (as shown in FIG. 3A). In addition, one of the source and drain (not shown) of the field effect transistor T is overlapped and electrically connected with one of the bit lines BL, and the other one of the source and drain of the field effect transistor T is overlapped and electrically connected with one of the capacitor contacts CC.

Figure 3B:
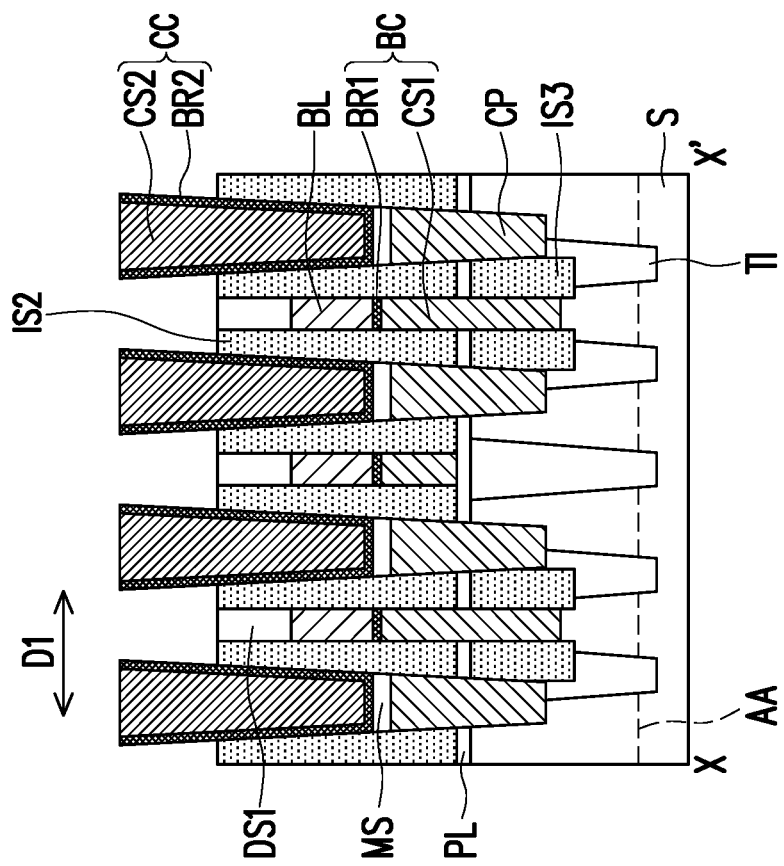
Figure 2B:
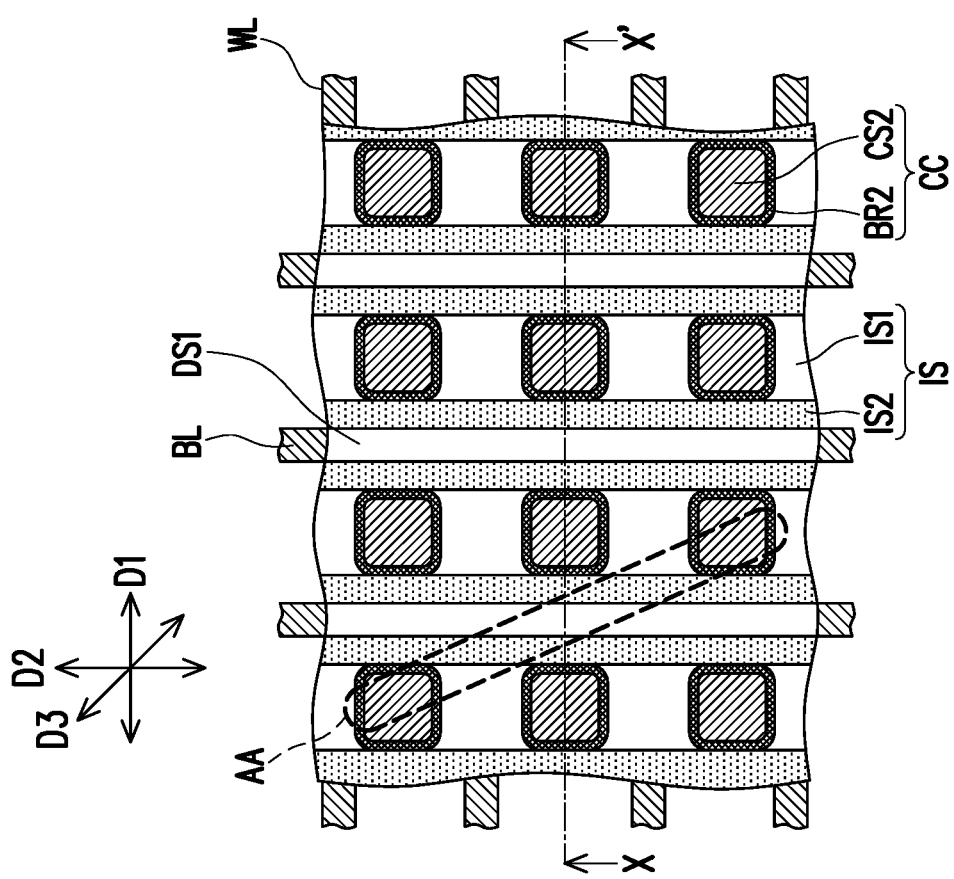
Figure 3C:
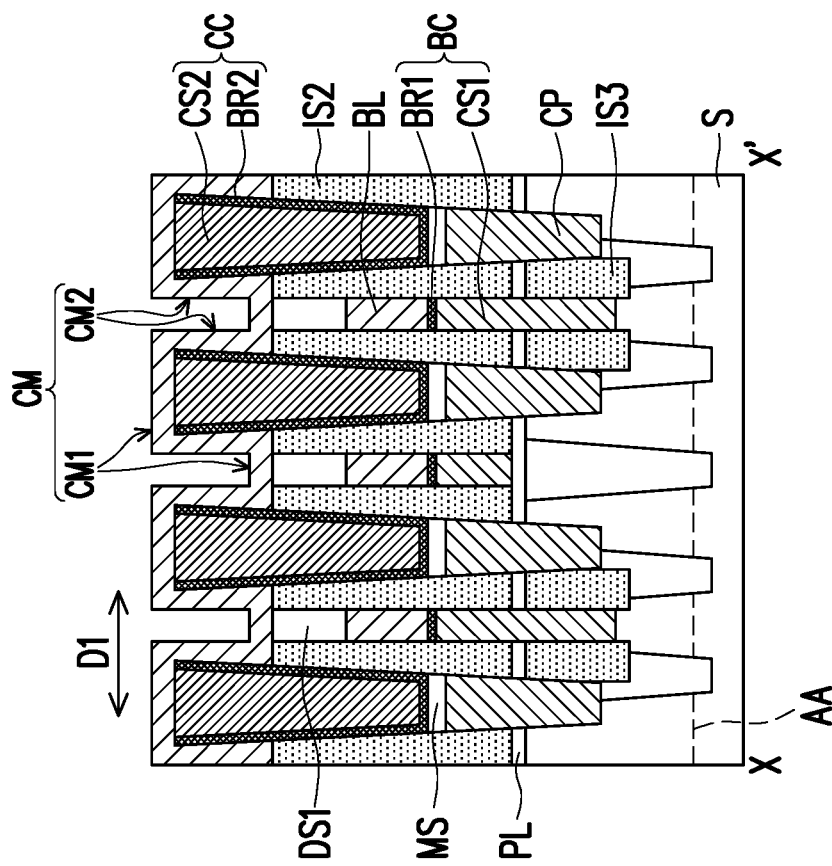
Figure 2C:
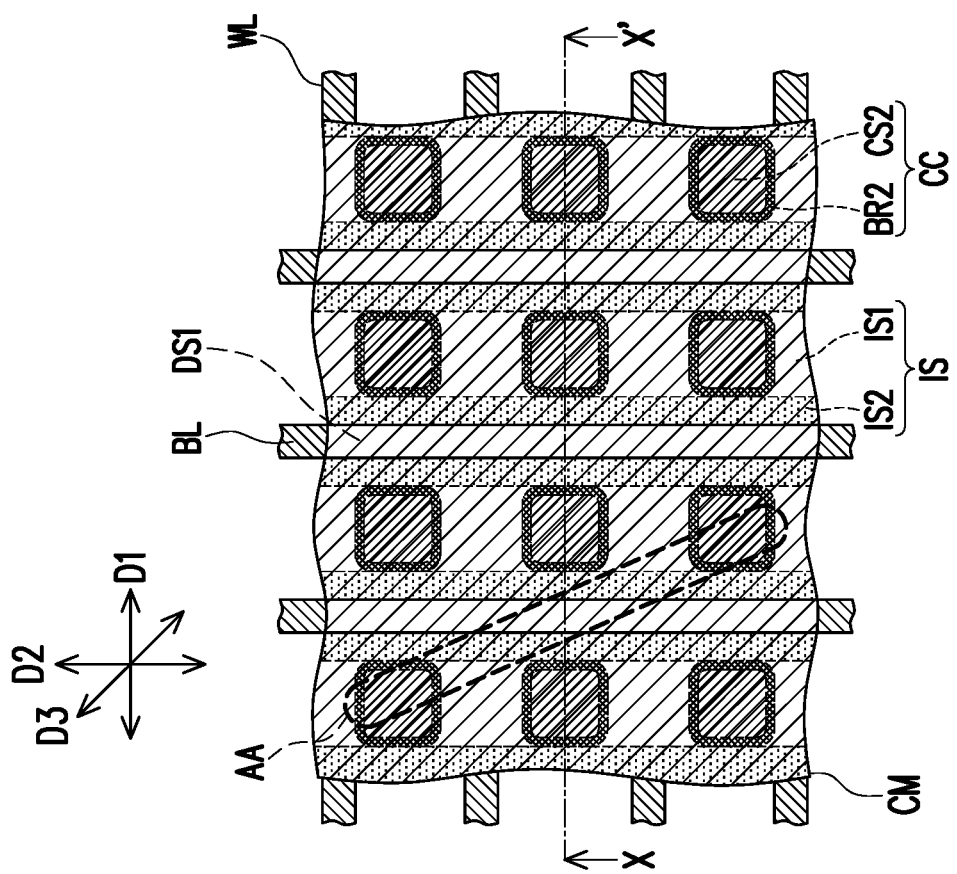
Figure 3D:
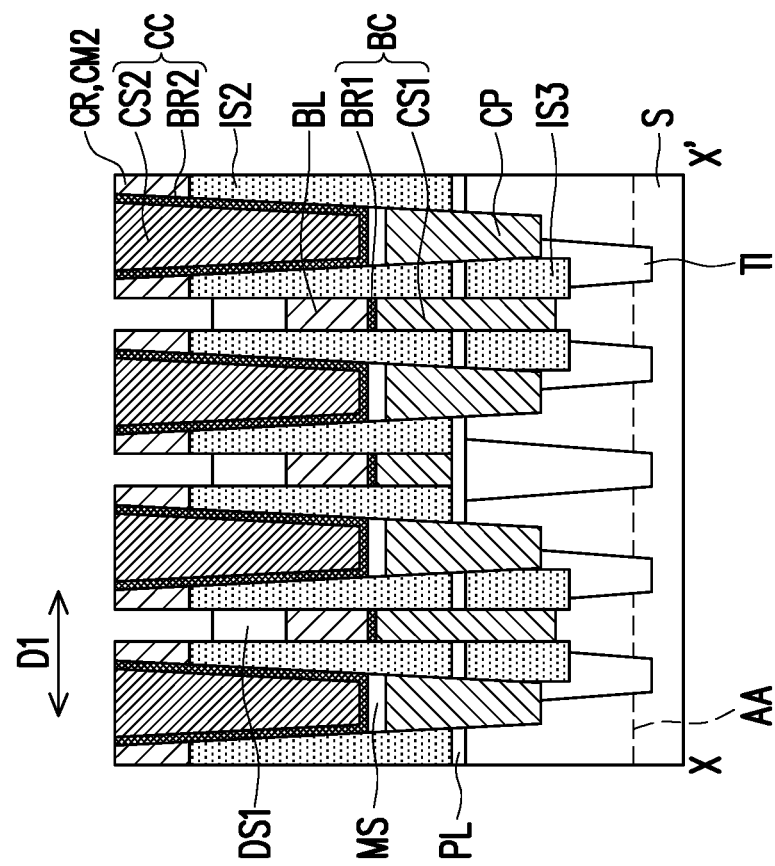
Figure 2D:
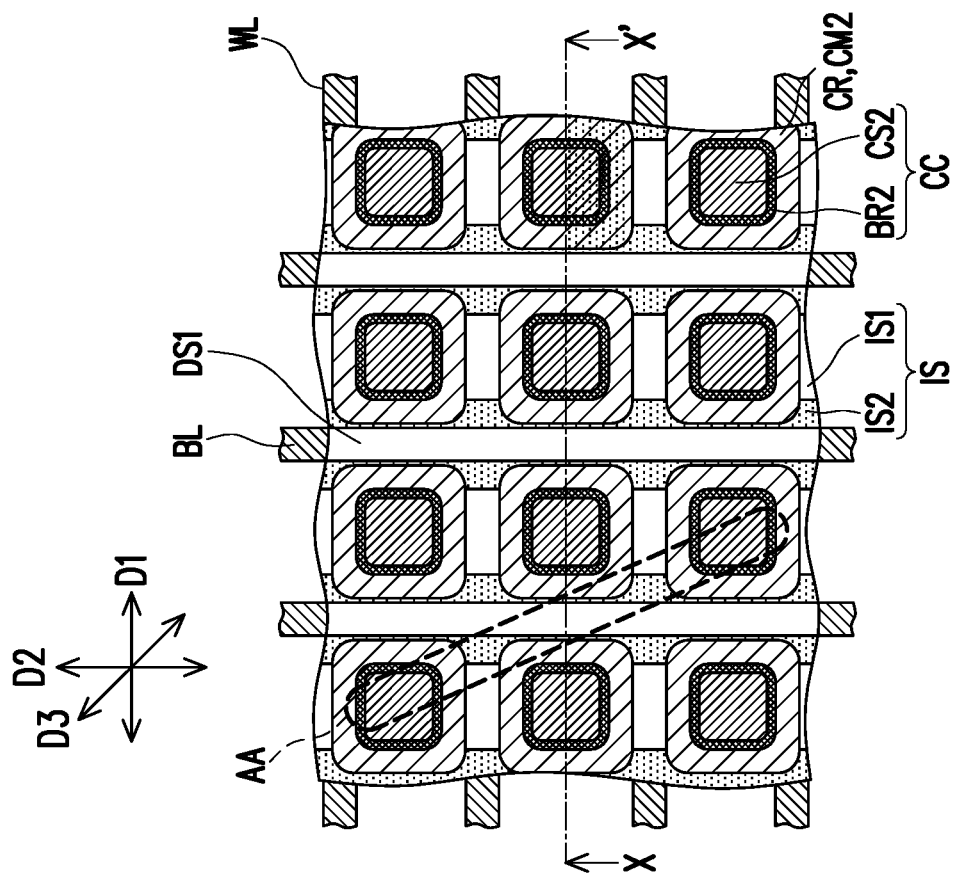
Figure 3E:
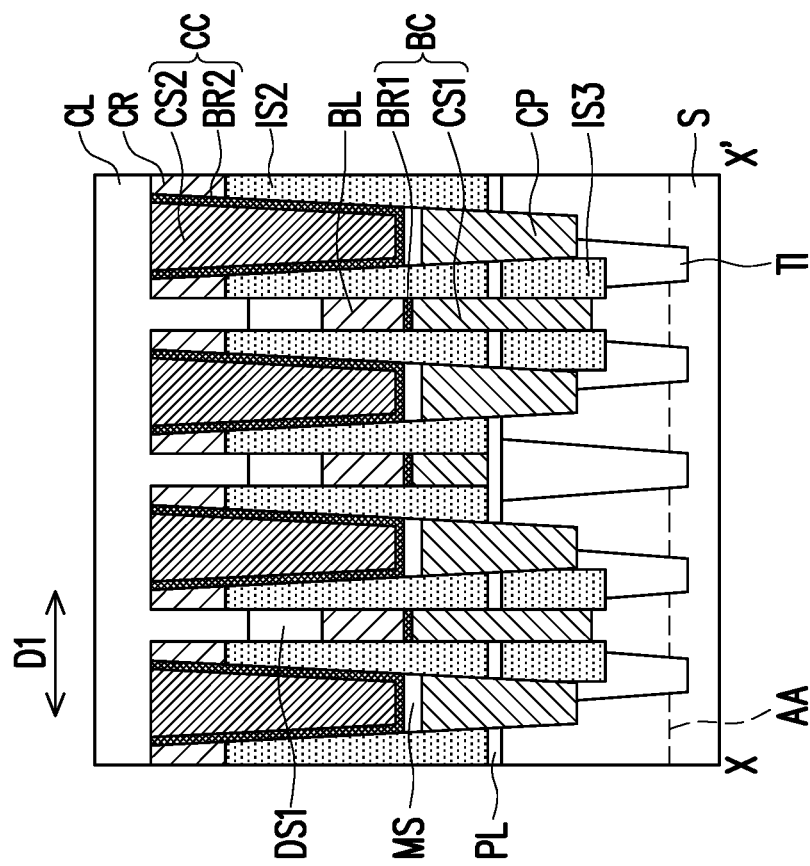
Figure 2E:
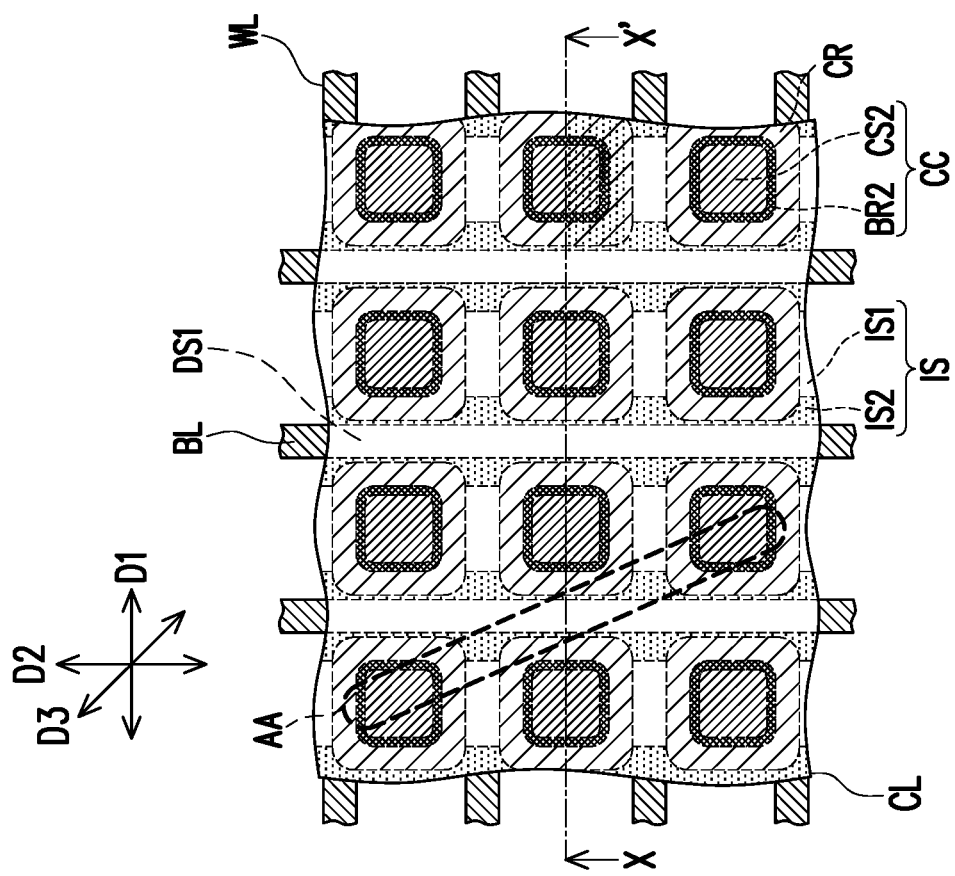
Figure 3F:
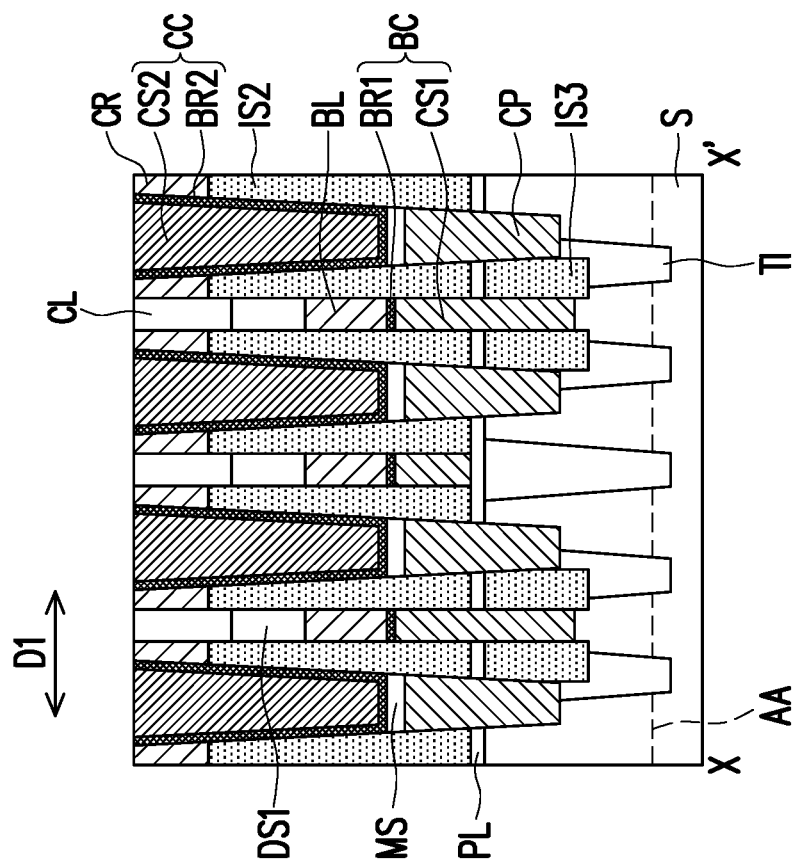
Figure 2F:
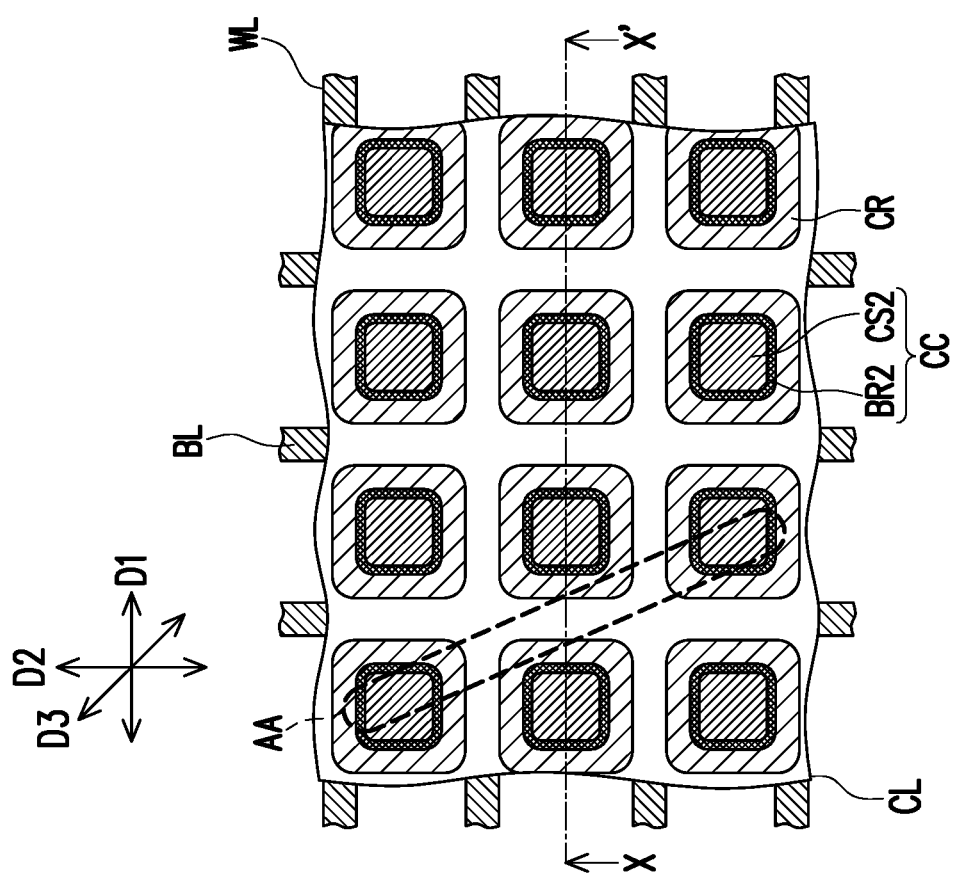
Figure 3G:
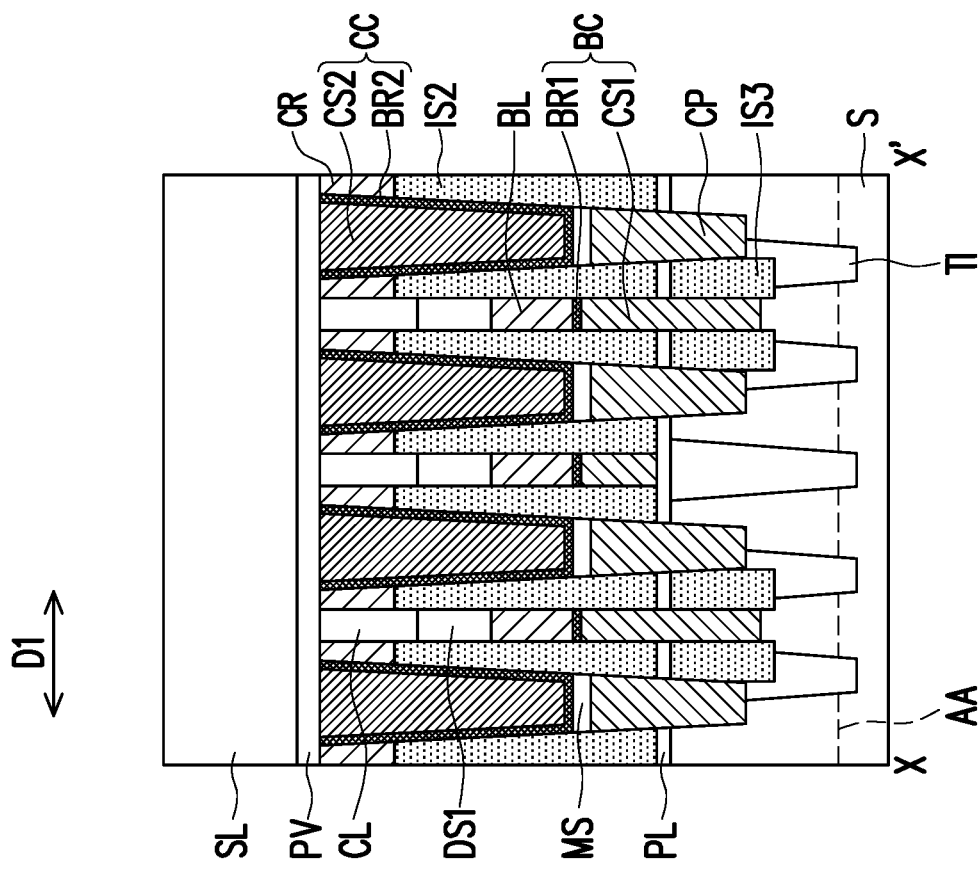
Figure 2G:
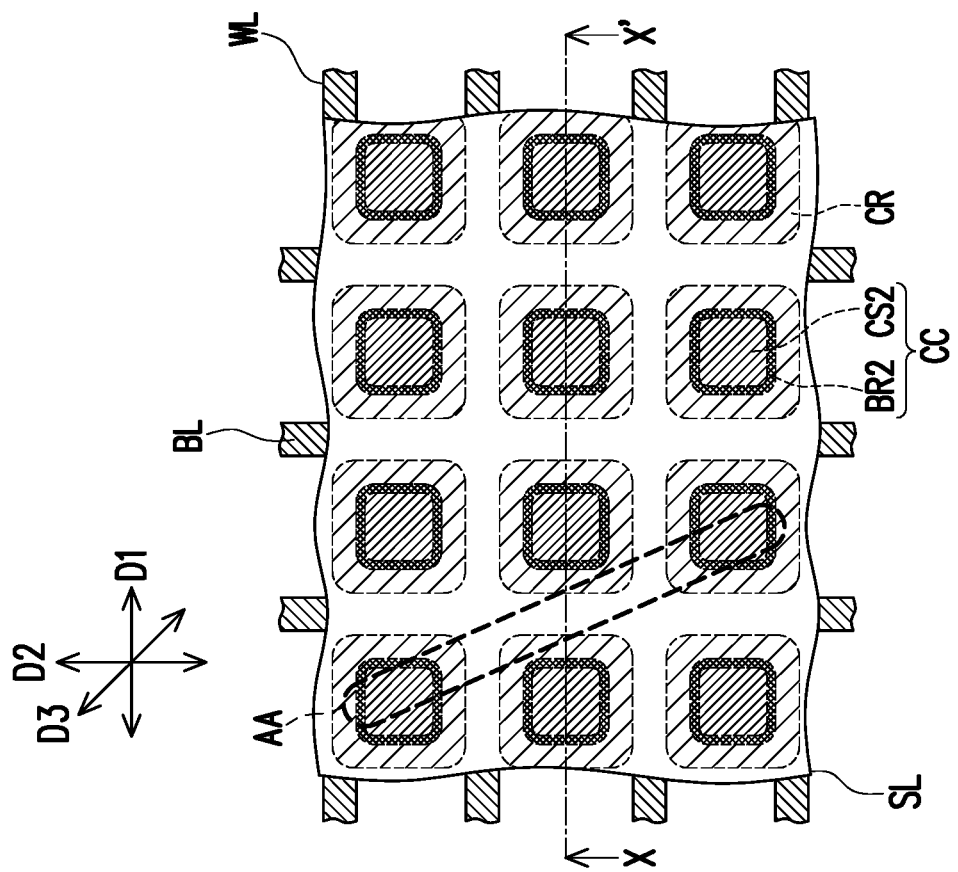
Figure 3H:
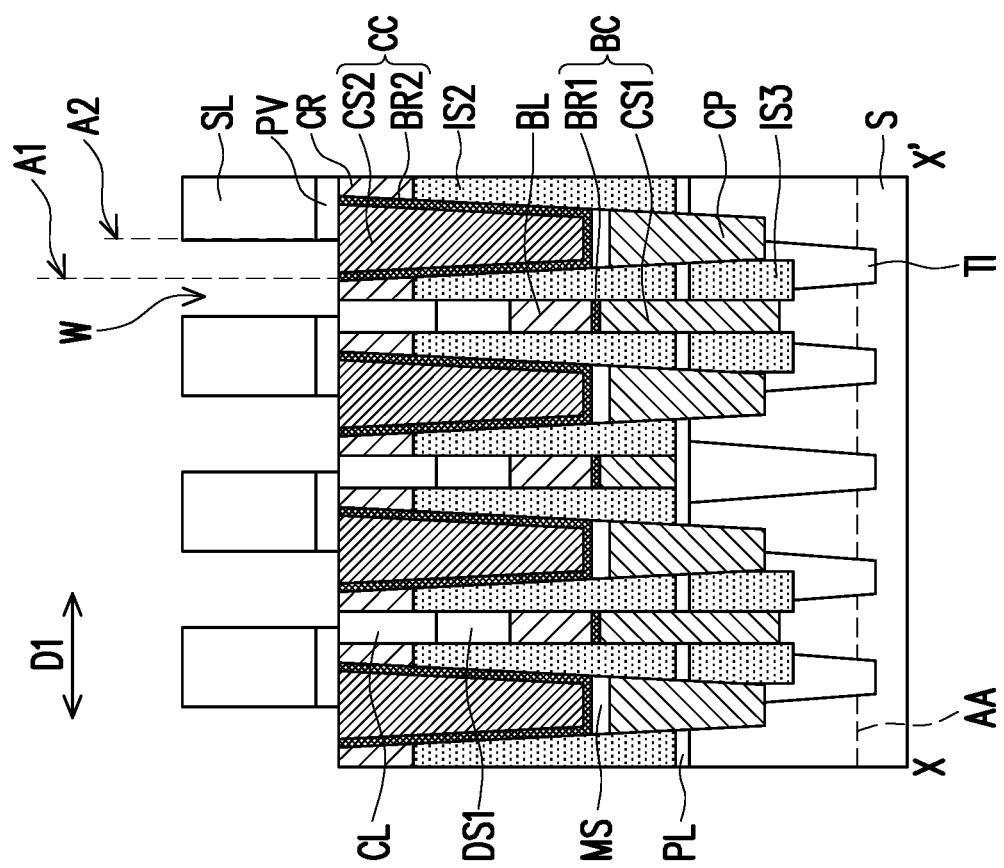
Figure 2H:
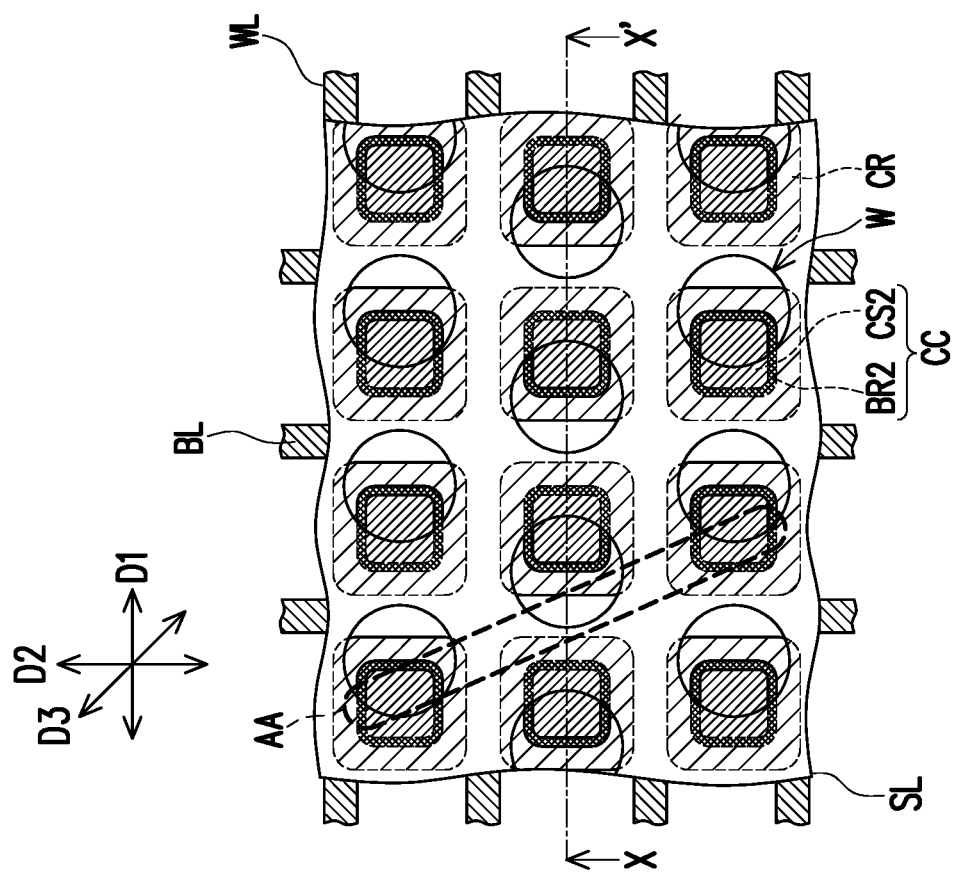
Figure 3I:
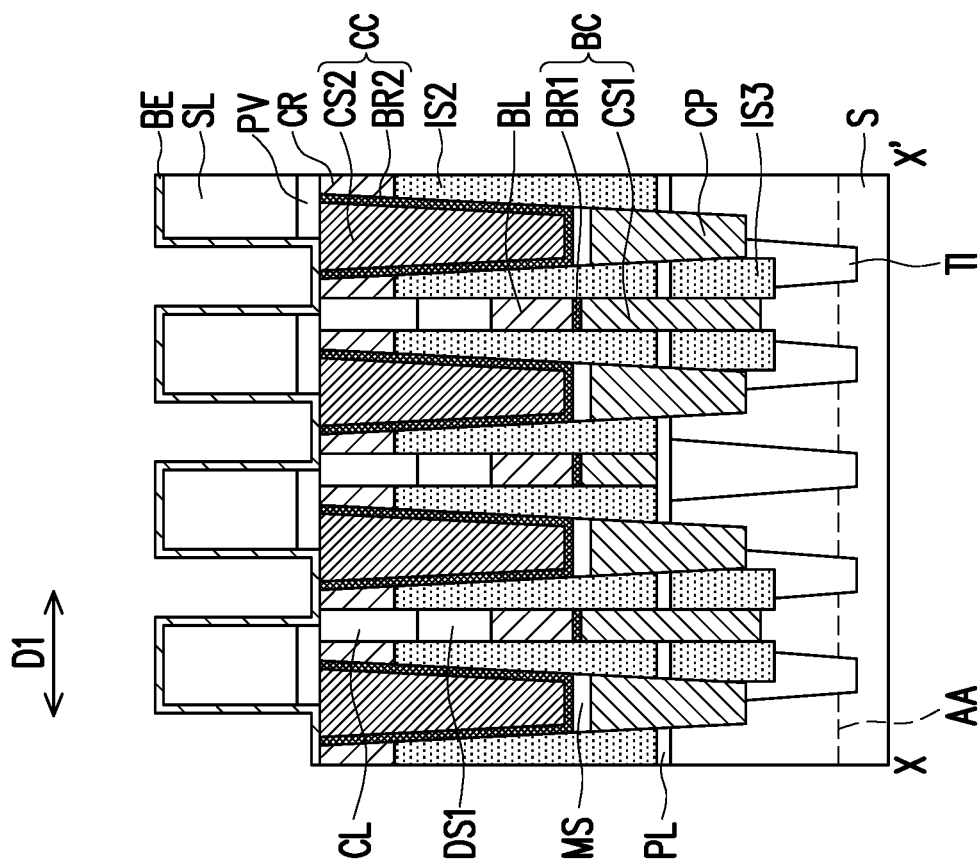
Figure 2I:
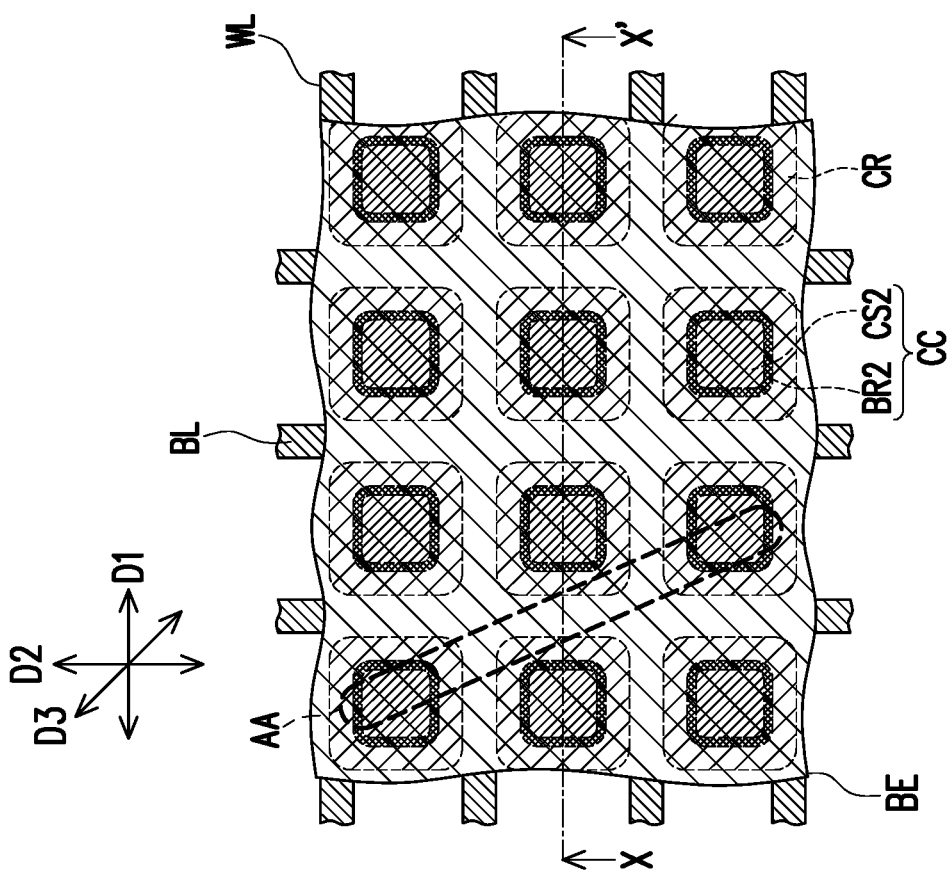
Figure 3J:
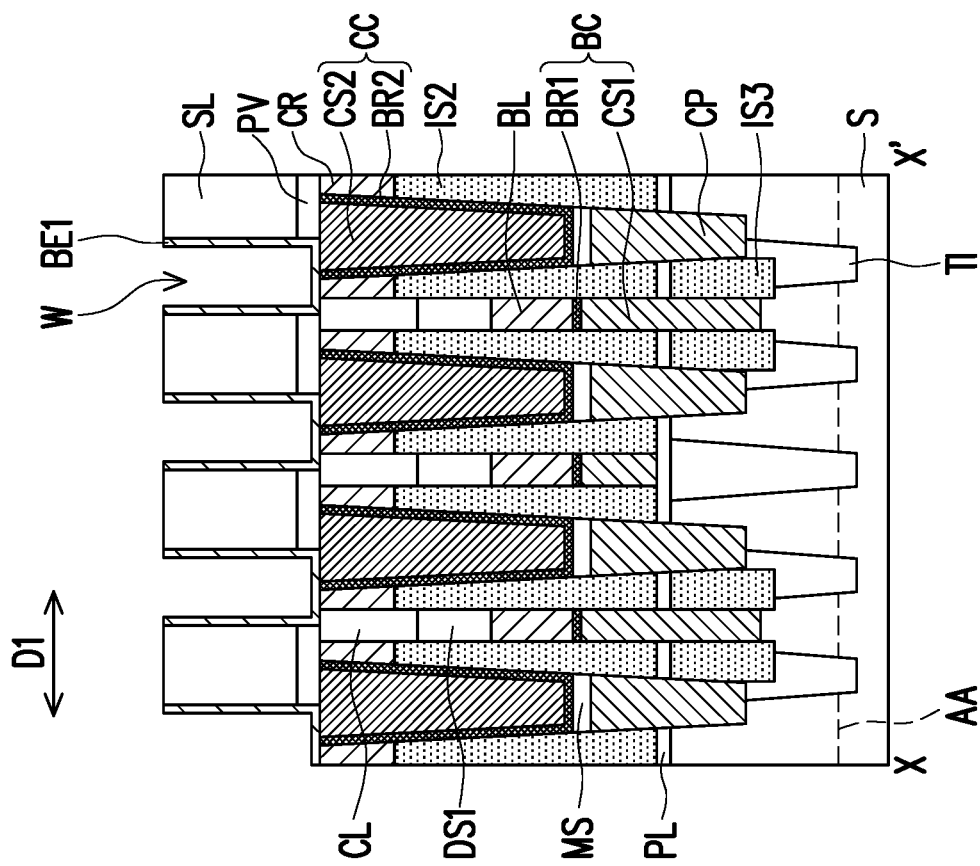
Figure 2J:
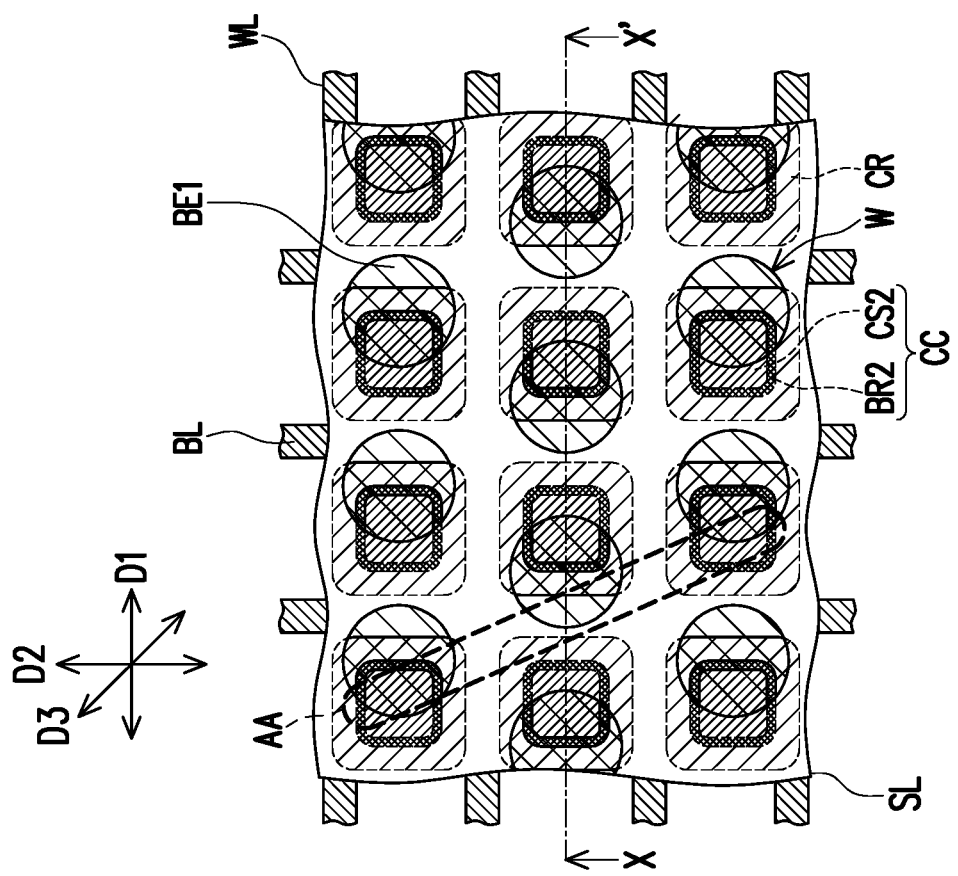
Figure 3K:
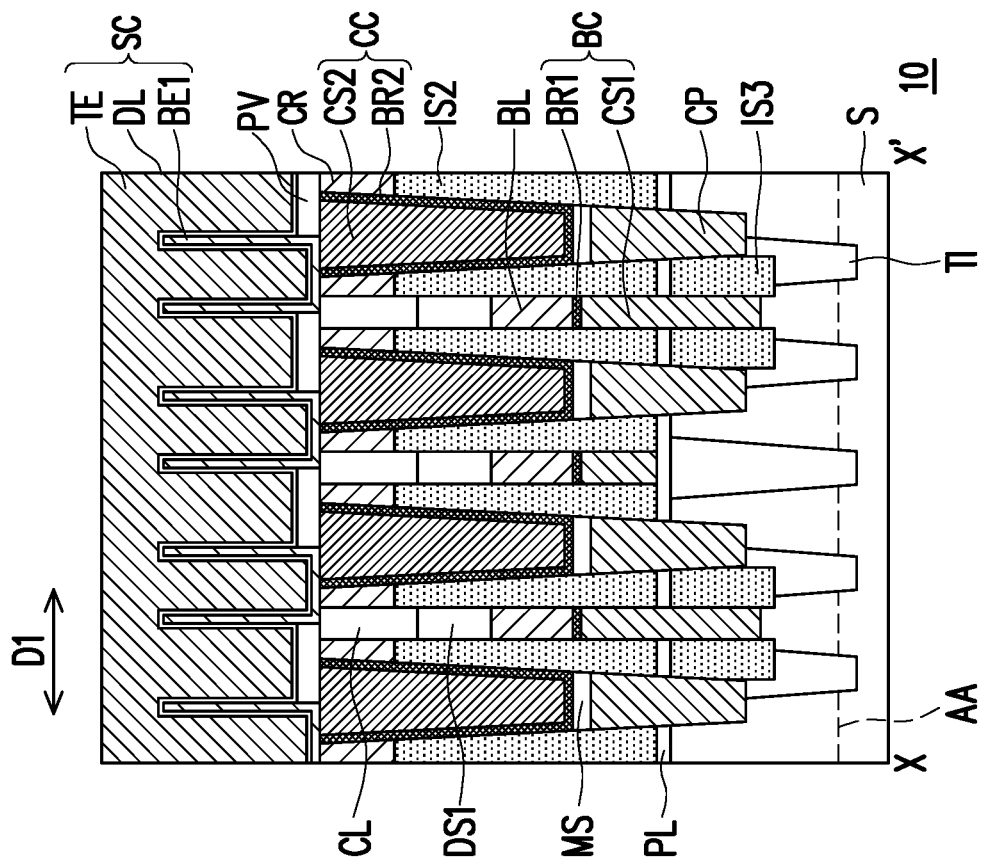
Figure 2K:
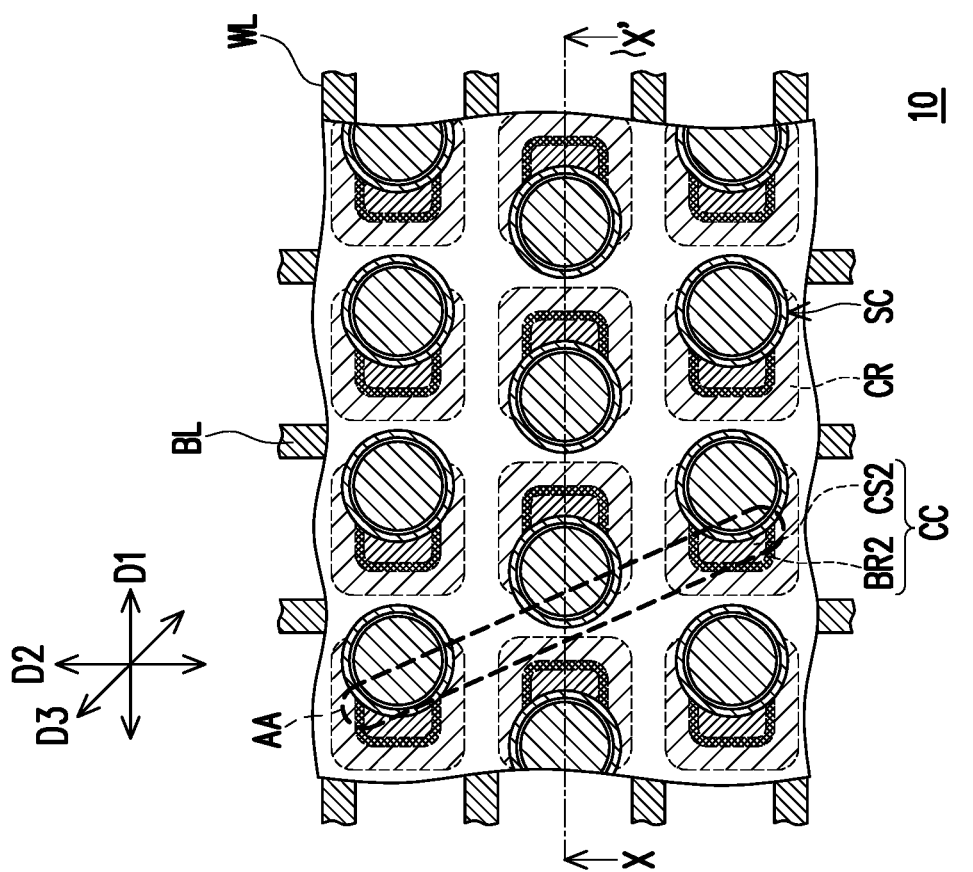

The capacitor contact CC is configured to be electrically connected between the field effect transistor T and the storage capacitor SC formed in the following steps (as shown in FIG. 2K and FIG. 3K). In some embodiments, the capacitor contacts CC are arranged in an array having rows along the first direction D1 and columns along the second direction D2. In some embodiments, each row of the capacitor contacts CC are at least partially overlapped with one of the word lines WL. In alternative embodiments, the capacitor contacts CC are not overlapped with the word lines WL. On the other hand, each column of the capacitor contacts CC are located aside one of the bit lines BL, and are not electrically connected with the bit line BL. Moreover, in some embodiments, the top view shapes of the capacitor contacts CC are substantially rectangular. However, those skilled in the art may modify the shapes of the capacitor contacts CC according to design requirements, the present disclosure is not limited thereto.

In some embodiments, each column of the capacitor contacts CC are formed in a stripe of isolation structure IS. The isolation structure IS may include inter-contact isolation structures IS1 and isolation sidewalls IS2. Along the column direction (i.e., the second direction D2), the inter-contact isolation structure IS1 is disposed between adjacent capacitor contacts CC, and the isolation sidewalls IS2 extend along opposite sidewalls of the capacitor contacts CC and the inter-contact isolation structures IS1. As such, adjacent capacitor contacts CC are separated from one another by the inter-contact isolation structures IS1 along the column direction (i.e., the second direction D2). In addition, along the row direction (i.e., the first direction D1), the capacitor contacts CC are separated from the adjacent bit lines BL by the isolation walls IS2. In some embodiments, materials of the inter-contact isolation structure IS1 and the isolation wall IS2 respectively include silicon nitride, silicon oxide, silicon oxynitride, low dielectric constant material (e.g., materials having dielectric constant less than 4) or combinations thereof. In certain embodiments, the isolation sidewall IS2 is a multilayer structure, such as an oxide/nitride/oxide (ONO) structure. In other embodiments, the isolation sidewall IS2 contains an air gap.

FIG. 3A is a schematic cross-sectional view along line X-X' shown in FIG. 2A. Referring to FIG. 2A and FIG. 3A, a plurality of trench isolation structures TI are formed in a substrate S. The trench isolation structures TI are functioned to isolate the active regions AA from one another. The trench isolation structures TI extend downwardly from a top surface of the substrate S. In some embodiments, the trench isolation structures TI include shallow trench isolation (STI) structures, deep trench isolation (DTI) structures or a combination thereof. In addition, in some embodiments, a material of the trench isolation structure TI includes silicon oxide or other insulating material.

The isolation structures IS including the inter-contact isolation structures IS1 and the isolation sidewalls IS2 are formed over the substrate S. The capacitor contacts CC and the bit lines BL can be regarded as being disposed in the isolation structures IS. In addition, the capacitor contacts CC and the bit lines BL are electrically connected with the active regions AA in the substrate S, such that the capacitor contacts CC and the bit lines BL could be electrically connected to the sources and drains (not shown) of the field effect transistors T formed in the active regions AA. As shown in FIG. 3A, the capacitor contacts CC and the bit lines BL are alternately arranged along the row direction (i.e., the first direction D1), and the isolation sidewalls IS2 are respectively located between adjacent capacitor contact CC and bit line BL. In some embodiments, bit line contacts BC are disposed and electrically connected between the bit lines BL and the active regions AA in the substrate S. The bit line BL and the underlying bit line contact BC are located between adjacent isolation sidewalls IS2. In some embodiments, the bit line BL and the underlying bit line contact BC are in physical contact between adjacent isolation sidewalls IS2. In addition, a sidewall of the bit line BL and a sidewall of the underlying bit line contact BC may be substantially coplanar with each other. In some embodiments, the bit line contacts BC respectively include a conductive structure CS1 and a barrier layer BR1 covering a top surface of the conductive structure CS1. On the other hand, in some embodiments, the capacitor contact CC may include a conductive structure CS2 and a barrier layer BR2 covering a bottom surface and a sidewall of the conductive structure CS2. Moreover, in some embodiments, contact plugs CP are respectively disposed between the capacitor contacts CC and the substrate S. The contact plugs CP are electrically connected between the capacitor contacts CC and the active regions AA in the substrate S, respectively. The capacitor contact CC and the underlying contact plug CP are located between adjacent isolation sidewalls IS2. In some embodiments, the capacitor contact CC and the underlying contact plug CP are in physical contact between adjacent isolation sidewalls IS2. In addition, a sidewall of the capacitor contact CC and a sidewall of the underlying contact plug CP may be substantially coplanar with each other. Furthermore, in some embodiments, metal silicide layers MS may be formed between the contact plugs CP and the capacitor contacts CC. In some embodiments, materials of the bit lines BL and the contact plugs CP include polysilicon. Materials of the conductive structure CS1 and CS2 may include W, whereas materials of the barrier layer BR1 and BR2 may respectively include TiN, TaN, TiW, the like or combinations thereof. In addition, a material of the metal silicide layers MS may include Co-silicide, W-silicide, Ti-silicide, Ta-silicide, the like or combinations thereof.

In some embodiments, the conductive structures CS1 of the bit line contacts BC vertically extend into the active regions AA in the substrate S. The extending portions of the conductive structures CS1 are respectively located between adjacent trench isolation structures TI. In addition, in some embodiments, the extending portions of some of the conductive structures CS1 are offset from the extending portions of the others of the conductive structures CS1 along the column direction (i.e., the second direction D2). In these embodiments, as shown in FIG. 3A, the extending portion(s) of some of the conductive structures CS1 (e.g., the middle one of the depicted conductive structures CS1) does not appear on the cross-sectional view along line X-X' shown in FIG. 3A. On the other hand, in some embodiments, the contact plugs CP also extend into the active regions AA in the substrate S. The extending portions of the contact plugs CP and the extending portions of the conductive structures CS1 of the bit line contacts BC are alternately arranged along the row direction (i.e., the first direction D1). In some embodiments, the contact plugs CP extend into the active regions AA and the adjacent trench isolation structures TI. In these embodiments, the contact plugs CP are overlapped with the trench isolation structures TI, and a spacing between adjacent contact plug CP and conductive structure CS1 may be shortened.

In some embodiments, isolation walls IS3 are formed in the substrate S, and are respectively located between the extending portions of adjacent contact plug CP and conductive structure CS1. In some embodiments, the isolation walls IS3 are respectively in physical contact with the extending portions of adjacent contact plug CP and conductive structure CS1. Some portions of the isolation sidewalls IS2 above the substrate S and the isolation walls IS3 formed in the substrate S are both located between adjacent contact plug CP and bit line contact BC, and the isolation walls IS3 are overlapped with the isolation sidewalls IS2. In some embodiments, the isolation walls IS3 may be formed in the trench isolation structures TI, and may laterally extend into the adjacent active regions AA. In addition, in some embodiments, bottom surfaces of the additional isolation walls IS3 are lower than bottom surfaces of the contact plugs CP and the conductive structures CS1. A material of the isolation walls IS3 may include silicon nitride, silicon oxide, silicon oxynitride, low dielectric constant material (e.g., materials having dielectric constant less than 4) or combinations thereof. In certain embodiments, the isolation wall IS3 is a multilayer structure, such as an oxide/nitride/oxide (ONO) structure. In other embodiments, the isolation wall IS3 contains an air gap.

In some embodiments, a pad layer PL is disposed between the isolation structures IS and the substrate S. In these embodiments, the contact plugs CP and the conductive structures CS1 of the bit line contacts BC can be regarded as penetrating through the pad layer PL and extend into the substrate S. A material of the pad layer PL may include silicon nitride, silicon oxide or a combination thereof. Furthermore, in some embodiments, top surfaces of the bit lines BL are lower than top surfaces of the capacitor contacts CC, and first dielectric structures DS1 and second dielectric structures DS2 are located in the recesses respectively defined by the sidewalls of adjacent isolation sidewalls IS2 and the top surface of the bit line BL therebetween. The second dielectric structures DS2 are stacked over the first dielectric structures DS1. As shown in FIG. 2A and FIG. 3A, the first and second dielectric structures DS1 and DS2 can be regarded as having a plurality of trenches in which the capacitor contacts CC and the isolation structures IS are located. As shown in FIG. 3A, top surfaces of the second dielectric structures DS2, the isolation sidewalls IS2 and the capacitor contacts CC may be substantially coplanar. In some embodiments, the second dielectric structures DS2 has a sufficient etching selectivity with respect to the first dielectric structures DS1. For instance, a material of the second dielectric structures DS2 may include silicon nitride, whereas a material of the first dielectric structures DS1 may include silicon oxide.

Referring to FIG. 1, FIG. 2B and FIG. 3B, step S102 is performed, and the second dielectric structures DS2 and portions of the isolation structures IS above the first dielectric structures DS1 are removed. As such, the capacitor contacts CC are now protruded from the top surfaces of the isolation structures IS (including the inter-contact isolation structures IS1 and the isolation sidewalls IS2) and the first dielectric structures DS1. In some embodiments, the second dielectric structures DS2 and portions of the isolation structures IS above the first dielectric structures DS1 are removed by an etching process, such as an isotropic etching process or an anisotropic etching process. During this etching process, the capacitor contacts CC may be functioned as etching masks. In addition, in those embodiments where the second dielectric structures DS2 has a sufficient etching selectivity with respect to the first dielectric structures DS1, the first dielectric structures DS1 may be functioned as etching stop layers during the etching process.

Referring to FIG. 1, FIG. 2C and FIG. 3C, step S104 is performed, and a conductive material layer CM is formed. In some embodiments, the conductive material layer CM is conformally formed over the whole structure shown in FIG. 2B and FIG. 3B. In this way, the top surfaces and the sidewalls of the capacitor contacts CC as well as the top surfaces of the isolation structures IS and the first dielectric structures DS1 are covered by the conductive material layer CM. The top surfaces of the capacitor contacts CC, the isolation structures IS and the first dielectric structures DS1 are covered by horizontally extending portions CM1 of the conductive material layer CM, whereas the sidewalls of the capacitor contacts CC are covered by vertically extending portions CM2 of the conductive material layer CM. In some embodiments, the recesses respectively located between the protruded portions adjacent capacitor contacts CC are not completely filled by the conductive material layer CM, and the conductive material layer CM has a recess corresponding to the topography of the underlying structure. In some embodiments, a material of the conductive material layer CM includes TiN, W, WN, the like or combinations thereof. In addition, a method for forming the conductive material layer CM may include a deposition process (e.g., a physical vapor deposition (PVD) process), a plating process or a combination thereof.

Referring to FIG. 1, FIG. 2D and FIG. 3D, step S106 is performed, and the horizontally extending portions CM1 of the conductive material layer CM are removed, whereas the vertically extending portions CM2 of the conductive material layer CM are remained. As shown in FIG. 3D, the remained portions of the conductive material layer CM (i.e., the vertically extending portions CM2) respectively surround the protruded portions of the capacitor contacts CC, and are also referred as conductive rings CR. In some embodiments, the horizontally extending portions CM1 of the conductive material layer CM are removed by an anisotropic etching process. In these embodiments, the conductive material layer CM is patterned to form the conductive rings CR via a self-aligning patterning process, and a lithography process is not required. In addition, during the anisotropic etching process, top portions of the first dielectric structures DS1 may be removed along with the removal of the horizontally extending portions CM1 of the conductive material layer CM. In this way, the top surfaces of the first dielectric structures DS1 are now recessed from the top surfaces of the isolation structures IS.

Referring to FIG. 1, FIG. 2E and FIG. 3E, step S108 is performed, and a capping layer CL is formed over the structure shown in FIG. 2D and FIG. 3D. In some embodiments, the capping layer CL is globally formed over the structure shown in FIG. 2D and FIG. 3D. In addition, the capping layer CL may further fill the recesses respectively located between adjacent conductive rings CR. As such, the exposed surfaces of the capacitor contacts CC, the conductive rings CR, the isolation structures IS and the second dielectric structures DS2 are covered by the capping layer CL. In some embodiments, these recesses are filled up by the capping layer CL. A material of the capping layer CL may include silicon nitride, silicon oxide or a combination thereof. In addition, a method for forming the capping layer CL may include a deposition process (e.g., a chemical vapor deposition (CVD) process) or a solution process (e.g., a spin coating process).

Referring to FIG. 1, FIG. 2F and FIG. 3F, step S110 is performed, and portions of the capping layer CL above the capacitor contacts CC are removed. As such, the top surfaces of the capacitor contacts CC and the conductive rings CR are exposed. In some embodiments, the top surfaces of the capacitor contacts CC, the conductive rings CR and the remained portion of the capping layer CL are substantially coplanar. A method for removing the portions of the capping layer CL above the capacitor contacts CC may include a planarization process (e.g., a chemical mechanical polishing (CMP) process), an etching process or a combination thereof.

Referring to FIG. 1, FIG. 2G and FIG. 3G, step S112 is performed, and a supporting layer SL is formed over the structure shown in FIG. 2F and FIG. 3F. In some embodiments, the supporting layer SL is globally formed over the structure shown in FIG. 2F and FIG. 3F. As such, the top surfaces of the conductive rings CR, the capacitor contacts CC and the remained portion of the capping layer CL are covered by the supporting layer SL. In some embodiments, before forming the supporting layer SL, a passivation layer PV is globally formed over the structure shown in FIG. 2F and FIG. 3F. In some embodiments, a material of the supporting layer SL may include silicon oxide, whereas a material of the passivation layer PV may include silicon nitride. Methods for forming the supporting layer SL and the passivation layer PV may respectively include a deposition process (e.g., a CVD process) or a solution process (e.g., a spin coating process).

Referring to FIG. 1, FIG. 2H and FIG. 3H, step S114 is performed, and portions of the supporting layer SL and the passivation layer PV are removed to form openings W. The openings W respectively expose a portion of the capacitor contact CC and a portion of the surrounding conductive ring CR. Moreover, in some embodiments, each of the openings W further exposes a portion of the adjacent capping layer CL. In some embodiments, a central axis A1 of the opening W is offset from a central axis A2 of the underlying capacitor contact CC along a certain direction (e.g., the first direction D1). In these embodiments, the opening W may not expose the whole top surface of the capacitor contact CC and the whole top surface of the surrounding conducive ring CR. In other words, some portions of the capacitor contact CC and the surrounding conductive ring CR are still covered by the supporting layer SL and the passivation layer PV. As shown in FIG. 2H, in some embodiments, the openings W are respectively overlapped with the underlying active region AA. Moreover, in some embodiments, top view shapes of the openings W are circular. However, those skilled in the art may modify the shapes of the openings W, the present disclosure is not limited thererto.

Referring to FIG. 1, FIG. 2I and FIG. 3I, step S116 is performed, and a bottom electrode layer BE is conformally formed over the current structure shown in FIG. 3I. In this way, the exposed surfaces of the capacitor contacts CC, the conductive rings CR and the capping layer CL as well as the exposed surfaces of the supporting layer SL and the passivation layer PV are covered by the bottom electrode layer BE. In some embodiments, a material of the bottom electrode layer BE include Ti, TiN, Ta, TaN, Ru, the like or combinations thereof. A method for forming the bottom electrode layer BE includes a deposition process (e.g., a PVD process), a plating process or a combination thereof.

Referring to FIG. 1, FIG. 2J and FIG. 3J, step S118 is performed, and portions of the bottom electrode layer BE above the supporting layer SL are removed. On the other hand, portions of the bottom electrode layer BE located in the openings W are remained, and are referred as bottom electrodes BE1 The bottom electrodes BE1 are respectively located within the span of one of the openings W. Each of the bottom electrodes BE1 covers a bottom surface and a sidewall of the corresponding opening W, and is electrically connected to one of the capacitor contacts CC and the surrounding conductive ring CR that are partially overlapped with one of the openings W. In those embodiments where some portions of the capping layer CL were exposed by the openings W, these portions of the capping layer CL are currently covered by the bottom electrodes BE1. In some embodiments, the portions of the bottom electrode layer BE above the supporting layer SL are removed via a planarization process. For instance, the planarization process may include a chemical mechanical polishing process, an etching process or a grinding process. After removing the portions of the bottom electrode layer BE above the supporting layer SL, a top surface of the supporting layer SL is exposed.

Referring to FIG. 1, FIG. 2K and FIG. 3K, step S120 is performed, such that the supporting layer SL is removed, and then a dielectric layer DL and a top electrode layer TE are sequentially formed. In some embodiments, the supporting layer SL is removed by an etching process. After removing the supporting layer SL, some portions of the bottom electrodes BE1 can be regarded as standing on the underlying structure and protruding from the passivation layer PV. The dielectric layer DL is conformally formed over the bottom electrodes BE1 and the passivation layer PV. Thereafter, the top electrode layer TE are formed over the dielectric layer DL. In some embodiments, the top electrode layer TE fills up the openings W and the spaces used to be occupied by the supporting layer SL, and a height of the top electrode layer TE is greater than a height of the standing portions of the bottom electrodes BE1. In addition, the top electrode layer TE may be subjected to a planarization process (e.g., a CMP process, an etching process or a grinding process), and has a substantially flat top surface. The bottom electrodes BE1, the dielectric layer DL and the top electrode layer TE constitute a plurality of storage capacitors SC. Each of the storage capacitors SC is electrically connected to one of the capacitor contacts CC and the surrounding conductive ring CR, and includes one of the bottom electrodes BE1, a portion of the top electrode layer TE and a portion of the dielectric layer DL therebetween. The bottom electrodes BE1 of the storage capacitors SC are laterally separated from one another and respectively in electrical contact with one of the capacitor contacts CC and the surrounding conductive ring CR, whereas the dielectric layer DL and the top electrode layer TE can be regarded as being shared by the storage capacitors SC. It should be noted that, only portions of the storage capacitors SC that are located in the openings W are depicted in FIG. 2K, whereas the other portions of the storage capacitors SC are omitted for conciseness. In some embodiments, a material of the dielectric layer DL may include silicon oxide, silicon nitride, TaO, TiO, ZrO, $Al_2O_3$, high dielectric constant material (e.g., materials having dielectric constant greater than 4), the like or combinations thereof. In addition, a material of the top electrode layer TE may include TiN, SiGe, W, the like or combinations thereof. In some embodiments, a method for forming the dielectric layer DL includes a deposition process (e.g., a CVD process), whereas a method for forming the top electrode layer TE includes a deposition process (e.g., a PVD process), a plating process or a combination thereof.

Up to here, manufacturing of a semiconductor device 10 is completed. The semiconductor device 10 may be a DRAM device. The semiconductor device 10 includes field effect transistors T (as shown in FIG. 2A) formed within the active regions AA in the substrate S, and includes storage capacitors SC formed over the substrate T. The capacitor contacts CC are disposed and electrically connected between the active regions AA and the storage capacitors SC, and the top portions of the capacitor contacts CC are respectively surrounded by one of the conductive rings CR. During the formation of the storage capacitors SC, the conductive rings CR may protect the underlying insulating elements (e.g., the isolation sidewalls IS2 and the first dielectric structures DS1) from being damaged by a possible etching process. Therefore, charge punch through from the storage capacitor SC via these insulating elements to the underlying bit line BL can be avoided, and a reliability of the semiconductor device 10 is improved. Furthermore, by disposing the conductive rings CR around the top portions of the capacitor contacts CC, the conductive area for the storage capacitors SC to be landed over is enlarged. Accordingly, contact margin between the storage capacitors SC and the capacitor contacts CC is increased. In addition, since the conductive rings CR can be formed by a self-aligning patterning process, an additional photolithography process is not required.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
    an active region, formed in a substrate;
    a bit line and a capacitor contact, disposed over the substrate and electrically connected with the active region, wherein the bit line is laterally separated from the capacitor contact, and a top surface of the bit line is lower than a topmost surface of the capacitor contact;
    a conductive ring, surrounding an upper portion of the capacitor contact, wherein a topmost surface of the conductive ring is substantially coplanar with the topmost surface of the capacitor contact; and
    a storage capacitor, disposed over and in electrical contact with the capacitor contact and the conductive ring.

2. The semiconductor device of claim 1, wherein the storage capacitor comprises a bottom electrode, a top electrode layer and a dielectric layer located between the bottom electrode and the top electrode layer, and the bottom electrode is partially overlapped with the capacitor contact and the conductive ring.

3. The semiconductor device of claim 2, wherein the capacitor contact and the conductive ring are entirely overlapped with the dielectric layer and the top electrode layer.

4. The semiconductor device of claim 2, wherein the bottom electrode is overlapped with the bit line.

5. The semiconductor device of claim 2, further comprising a passivation layer, wherein the passivation layer is disposed aside the bottom electrode of the storage capacitor, and wherein the capacitor contact and the conductive ring are covered by the passivation layer and the bottom electrode.

6. The semiconductor device of claim 1, wherein the top surface of the bit line is lower than a bottom surface of the conductive ring.

7. The semiconductor device of claim 1, wherein the storage capacitor is in physical contact with the capacitor contact and the conductive ring.

8. The semiconductor device of claim 1, further comprising:
    an isolation structure, disposed over the substrate, wherein a lower portion of the capacitor contact is surrounded by the isolation structure, and a portion of the isolation structure is located between the capacitor contact and the bit line.

9. The semiconductor device of claim 8, wherein the capacitor contact is surrounded by the conductive ring and the isolation structure.

10. The semiconductor device of claim 1, further comprising:
    contact plug, extending between the capacitor contact and the active region.

11. The semiconductor device of claim 10, wherein the contact plug extends into the active region.

12. The semiconductor device of claim 1, further comprising:
    a bit line contact, extending between the bit line and the active region.

* * * * *